US010396793B2

(12) United States Patent
Furuichi

(10) Patent No.: US 10,396,793 B2
(45) Date of Patent: Aug. 27, 2019

(54) LEVEL SHIFT CIRCUIT

(71) Applicant: LAPIS Semiconductor Co., Ltd., Yokohama (JP)

(72) Inventor: Shuji Furuichi, Tokyo (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/962,895

(22) Filed: Apr. 25, 2018

(65) Prior Publication Data

US 2018/0316351 A1 Nov. 1, 2018

(30) Foreign Application Priority Data

Apr. 26, 2017 (JP) .................................. 2017-087240

(51) Int. Cl.
| | |
|---|---|
| *H03K 19/0185* | (2006.01) |
| *H03K 3/356* | (2006.01) |
| *H03K 3/011* | (2006.01) |
| *H03K 3/012* | (2006.01) |

(52) U.S. Cl.
CPC ......... *H03K 19/0185* (2013.01); *H03K 3/011* (2013.01); *H03K 3/012* (2013.01); *H03K 3/35613* (2013.01); *H03K 3/356104* (2013.01); *H03K 3/356182* (2013.01)

(58) Field of Classification Search
CPC ..................... H03K 3/356104; H03K 19/0185
See application file for complete search history.

(56) References Cited

U.S. PATENT DOCUMENTS

| | | | | |
|---|---|---|---|---|
| 5,880,601 | A * | 3/1999 | Kanazawa ..... | H03K 19/018521 326/68 |
| 6,677,807 | B1 * | 1/2004 | Brokaw .................. | G05F 3/265 323/316 |
| 7,394,283 | B2 * | 7/2008 | Hsu ................ | H03K 19/018528 326/115 |
| 7,468,615 | B1 * | 12/2008 | Tan .................. | H03K 19/00315 326/68 |
| 2003/0001628 | A1 * | 1/2003 | Hsu ........................ | H03K 3/012 327/103 |

(Continued)

FOREIGN PATENT DOCUMENTS

JP H05-284005 A 10/1993

*Primary Examiner* — Alexander H Taningco
*Assistant Examiner* — Kurtis R Bahr
(74) *Attorney, Agent, or Firm* — Rabin & Berdo, P.C.

(57) ABSTRACT

A level shift circuit includes: a constant-current generation unit; a current mirror unit that flows the constant-current through first and second lines; and a level shift unit that receives first and second input signals, the first input signal being varied between first and second logic levels and having first and second potentials at the first and second logic levels respectively, the second input signal being a phase-inverted signal of the first input signal, the level shift unit producing first and second output signals that are acquired by shifting a signal level at the first logic level of the first and second input signals from the first potential to the power supply potential, the level shift unit outputting the first output signal from a node on the second line and outputting the second output signal from a node on the first line. The constant-current generation unit includes a current adjustment circuit which varies the constant current value depending on a variation in the first potential.

2 Claims, 6 Drawing Sheets

(56) References Cited

U.S. PATENT DOCUMENTS

| | | | | |
|---|---|---|---|---|
| 2004/0061525 A1* | 4/2004 | Tamaki | ............... | H03K 17/102 |
| | | | | 326/81 |
| 2006/0097791 A1* | 5/2006 | Shuler, Jr. | ................ | H03F 1/08 |
| | | | | 330/292 |
| 2014/0320168 A1* | 10/2014 | Luo | ................... | H03K 19/0013 |
| | | | | 326/80 |
| 2015/0280695 A1* | 10/2015 | Li | ..................... | H03K 3/35613 |
| | | | | 327/109 |
| 2015/0288365 A1* | 10/2015 | Lai | ....................... | G11C 16/14 |
| | | | | 327/333 |
| 2015/0381180 A1* | 12/2015 | Tsuji | ............. | H03K 19/018521 |
| | | | | 327/319 |
| 2016/0006429 A1* | 1/2016 | Mori | ................... | H02M 1/088 |
| | | | | 323/312 |

* cited by examiner

LEVEL SHIFT CIRCUIT

BACKGROUND OF THE INVENTION

1. Field of the Invention

The present invention relates to a level shift circuit.

2. Description of the Related Art

In recent years, driving circuits for LCD (Liquid Crystal Display) drivers and OLED (Organic Light Emitting Diode) drivers have been increasingly highly integrated to drive the driving circuit with a supply voltage at a high voltage, whereas supply voltages on the low-voltage side for driving logic elements have been more reduced to lower voltages.

On the other hand, for example, large OLEDs used for TVs may be subjected to variations or degradation over time in the characteristics of the panel elements. Thus, to correct the characteristics of the pixels, the OLED driver is provided with an ADC (Analog to Digital Converter) for measuring the characteristics of the panel elements, and thereby the element characteristics are measured. With an increase in the speed of AD conversion by the ADC, it is required to increase the speed of the level shift circuit (level shifter) for converting low-voltage signals to high-voltage signals.

The high integration and the high-speed operation of the level shift circuit are mutually contradictory characteristics. To achieve the mutually contradictory characteristics, a constant-current type level shift circuit has been devised (for example, Patent Literature 1: Japanese Patent Application Laid-Open No. Hei. 5-284005). For example, such a constant-current type level shift circuit is comprised of a constant-current generation unit for generating a constant current on the basis of a supply voltage, a current mirror unit for flowing the same current as the generated constant current, and a level shift unit for converting a low-voltage signal to a high-voltage signal while inverting a node potential.

When a high-speed operation is required in the constant-current type level shift circuit, the constant-current generation unit is required to flow a large amount of constant current. Furthermore, to invert the node potential with reliability in the level shift unit, it is required to set the current capability so that an element to receive a low-voltage signal is capable of flowing a current equal to or greater than the constant current.

On the other hand, in the case of degradation in the current capability of the element due to degradation in the signal level of the low-voltage signal, it was required to reduce the constant current, for example, by increasing the resistance of the constant-current generation unit.

Furthermore, since elements to receive the low-voltage signal are varied in the current capability in contrast to the value of the constant current being set to be constant at the time of design, the elements are required to have a size allowance, thus causing an increase in the element region.

SUMMARY OF THE INVENTION

The present invention has been made in view of the aforementioned problems. It is therefore an object of the present invention to provide a level shift circuit which is capable of operating with reliability even when elements are varied in current capability.

A level shift circuit according to the present invention includes: a constant-current generation unit configured to generate a constant current on the basis of a power supply potential; a current mirror unit configured to flow the constant current through a first line and a second line; and a level shift unit configured to receive a first input signal and a second input signal being inputted, the first input signal being varied in signal level between a first logic level and a second logic level and having a first potential at the first logic level and a second potential at the second logic level, the second input signal being acquired by inverting a phase of the first input signal, the level shift unit being configured to produce a first output signal and a second output signal that are acquired by shifting a signal level at the first logic level of the first input signal and the second input signal from the first potential to the power supply potential, the level shift unit being configured to output the first output signal from a node on the second line and output the second output signal from a node on the first line, wherein the constant-current generation unit includes a current adjustment circuit to which the first potential is applied, the current adjustment circuit being configured to vary a value of the constant current depending on a variation in the first potential.

According to the level shift circuit of the present invention, it is possible to perform a level shift operation with reliability even when the current capability of an element is varied.

DETAILED DESCRIPTION OF THE INVENTION

Figure 1:
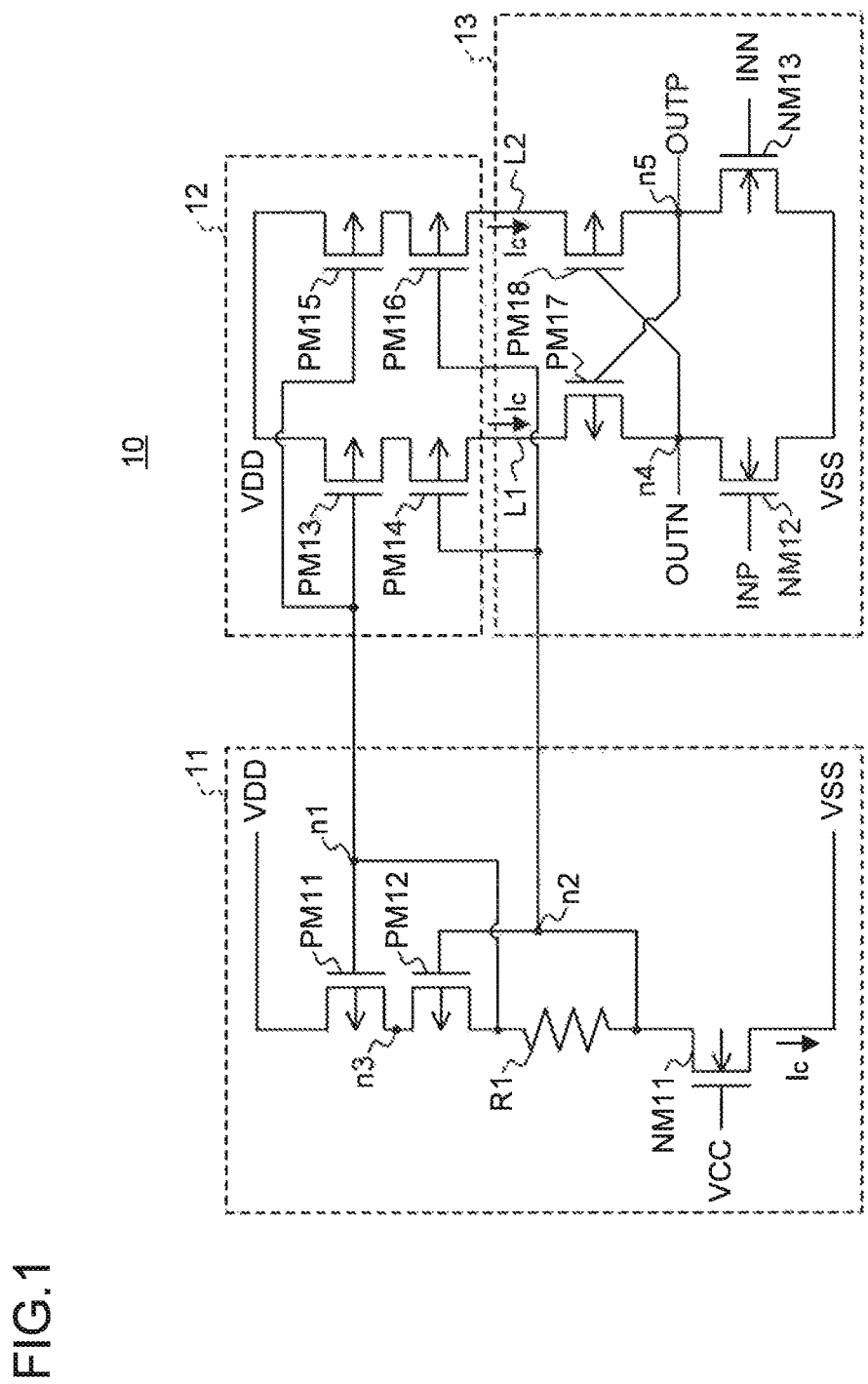
FIG. 1 is a circuit diagram illustrating a configuration of a level shift circuit according to a first embodiment of the present invention.

A description will now be given of embodiments of the present invention with reference to the drawings. Note that in the description of each embodiment below and the attached drawings, substantially the same or equivalent parts will be denoted by the same reference numerals.

First Embodiment

A level shift circuit 10 according to a first embodiment of the present invention converts (shifts in level) a low-voltage signal to a high-voltage signal, and is used in display drivers such as LCD (Liquid crystal Display) drivers or OLED (Organic Light Emitting Diode) drivers. For example, the level shift circuit 10 receives a low-voltage control signal supplied from a timing controller (not illustrated), and converts the control signal to a high-voltage signal for driving display pixels.

FIG. 1 is a view illustrating the configuration of the level shift circuit 10 according to the first embodiment. The level shift circuit 10 is comprised of a constant-current generation unit 11, a current mirror unit 12, and a level shift unit 13.

The constant-current generation unit 11 includes a transistor PM11 and a transistor PM12, which are a P-channel type (or, first channel type) MOS (Metal Oxide Semiconductor) transistor, a resistor R1, and a transistor NM11 that is an N-channel type (or, second channel type) MOS transistor.

The transistor PM11 has the source to which a supply voltage VDD is applied. The drain of the transistor PM11 is connected to the source of the transistor PM12 via a node n3. The gate of the transistor PM11 is connected to a node n1, and is connected to the drain of the transistor PM12 and to one end of the resistor R1 via the node n1.

The drain of the transistor PM12 is connected to the one end of the resistor R1. The gate of transistor PM12 is connected to a node n2, and is connected to the other end of the resistor R1 via the node n2.

The drain of the transistor NM11 is connected to the other end of the resistor R1. Furthermore, the drain of the transistor NM11 is connected to the gate of the transistor PM12 via the node n2. The source of the transistor NM11 is connected to a ground potential VSS. The transistor NM11 has the gate to which a low supply voltage VCC is applied. The low supply voltage VCC has a voltage level that is lower than the supply voltage VDD.

The transistor NM11 has the drain through which a drain current flows depending on the low supply voltage VCC. This drain current flows, as a constant current Ic, through the resistor R1, and the transistors PM11 and PM12. The transistor NM11 serves as a current adjustment circuit for adjusting the current value of the constant current Ic depending on the voltage level of the low supply voltage VCC.

Figure 2:
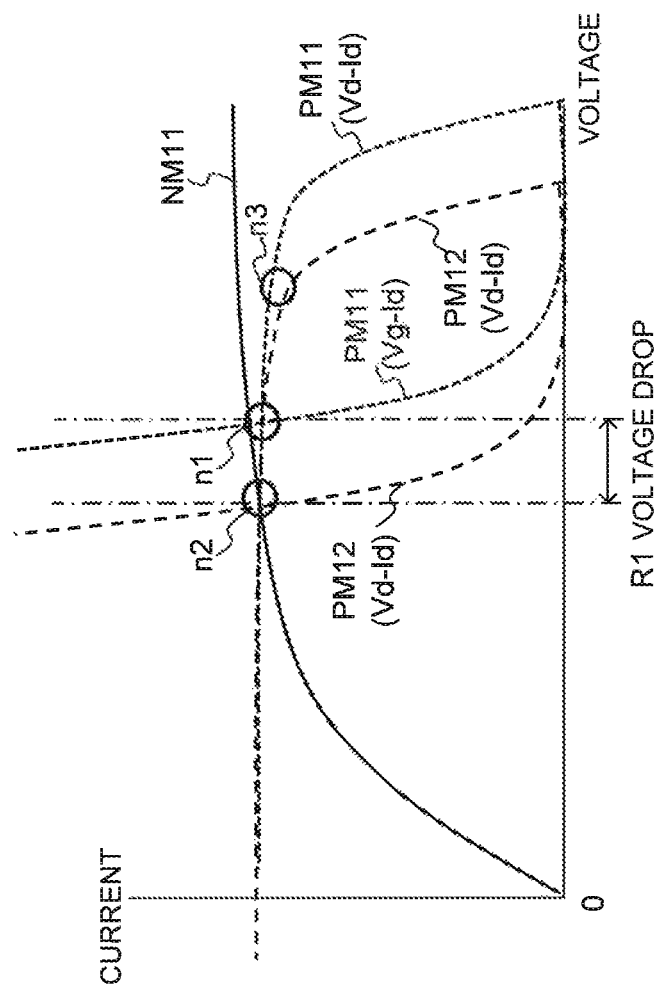
FIG. 2 is a view illustrating operating points of each unit in the level shift circuit according to the first embodiment.

FIG. 2 is a view illustrating the voltage-current curves of the resistor R1, the transistor NM11, and the transistors PM11 and PM12. The potentials of the nodes n1 and n2 (circled in the figure) are set by taking into account the operating points of each of the transistors PM11 and PM12. The resistance value of the resistor R1 is adjusted so that the potential of the node n3 takes a good region of the constant current characteristics of the transistor PM11.

Referring back to FIG. 1, the current mirror unit 12 is configured from transistors PM13, PM14, PM15, and PM16, which are a P-channel type MOS transistor.

The transistor PM13 has the source to which the supply voltage VDD is applied. The drain of the transistor PM13 is connected to the source of the transistor PM14. The gate of the transistor PM13 is connected via the node n1 to the gate of the transistor PM11, and to the drain of the transistor PM12 and the one end of the resistor R1.

The source of the transistor PM14 is connected to the drain of the transistor PM13. The gate of the transistor PM14 is connected via the node n2 to the gate of the transistor PM12, and to the other end of the resistor R1 and the drain of the transistor NM11.

The transistor PM15 has the source to which the supply voltage VDD is applied. The gate of the transistor PM15 is connected to the gate of the transistor PM13.

The source of the transistor PM16 is connected to the drain of the transistor PM15. The gate of the transistor PM16 is connected to the gate of the transistor PM14. Furthermore, the gate of the transistor PM16 is connected via the node n2 to the gate of the transistor PM12, and to the other end of the resistor R1 and the drain of the transistor NM11.

The transistors PM11 and PM13 have the gates connected together via the node n1, and the transistors PM12 and PM14 have the gates connected together via the node n2, thereby constituting a current mirror circuit. This allows a current flowing through the constant-current generation unit 11 to be copied and the constant current Ic to flow through a line L1 connected to the drain of the transistor PM14. That is, the transistors PM11, PM12, PM13, and PM14 constitute a two-stage cascade constant-current source.

The transistors PM11 and PM15 have the gates connected together via the node n1, and the transistors PM12 and PM16 have the gates connected together via the node n2, thereby constituting a current mirror circuit. This allows a current flowing through the constant-current generation unit 11 to be copied and the constant current Ic to flow through a line L2 connected to the drain of the transistor PM16. That is, the transistors PM11, PM12, PM15, and PM16 constitute a two-stage cascade constant-current source.

The level shift unit 13 is comprised of transistors PM17 and PM18, which are a P-channel type MOS transistor, and transistors NM12 and NM13 that are an N-channel type MOS transistor.

The source of the transistor PM17 is connected to the drain of the transistor PM14. The drain of the transistor PM17 is connected via a node n4 to the gate of the transistor PM18 and the drain of the transistor NM12. The gate of the transistor PM17 is connected via a node n5 to the drain of the transistor PM18 and the drain of the transistor NM13.

The source of the transistor PM18 is connected to the drain of the transistor PM16. The drain of the transistor PM18 is connected via the node n5 to the gate of the transistor PM17 and to the drain of the transistor NM13. The gate of the transistor PM18 is connected via the node n4 to the drain of the transistor PM17 and the drain of the transistor NM12.

The source of the transistor NM12 is connected to the ground potential VSS. The drain of the transistor NM12 is connected via the node n4 to the drain of the transistor PM17 and the gate of the transistor PM18. The transistor NM12 has the gate to which an input signal INP is supplied.

The input signal INP varies in signal level between logic level 1 (H level) and logic level 0 (L level), taking on the potential level of the low supply voltage VCC at logic level 1 and the potential level of the ground potential VSS at logic level 0. In the descriptions below, the potential level of the low supply voltage VCC will also be referred to as the VCC potential. Furthermore, the potential level of the ground potential VSS will also be referred to as 0 V. Furthermore, the voltage level of the supply voltage VDD will also be referred to as the VDD potential.

The source of the transistor NM13 is connected to the ground potential VSS. The drain of the transistor NM13 is connected via the node n5 to the gate of the transistor PM17 and the drain of the transistor PM18. The transistor NM13 has the gate to which an inverted input signal INN being a phase-inverted signal of the input signal INP is supplied.

The inverted input signal INN has the phase opposite to that of the input signal INP and varies in signal level between logic level 1 and logic level 0, taking on the Vcc potential at logic level 1 and 0 V at logic level 0. Therefore, while the low supply voltage VCC is applied to the gate of the transistor NM12, 0 V is applied to the gate of the transistor NM13, and while the low supply voltage VCC is applied to the gate of the transistor NM13, 0 V is applied to the gate of the transistor NM12.

The transistors PM17 and PM18 have the gates crossed so as to connect to the node n5 and the node n4, respectively, constituting a level shifter in conjunction with the transistors NM12 and NM13. The transistors NM12 and NM13 are laid out in pair under the same process conditions as those of the transistor NM11, and are set to have a channel width at NM11:(NM12, NM13)=1:N (N is an integer from 2 to 6).

The level shift circuit 10 according to this embodiment is provided with the bias settings under the conditions mentioned above. A description will next be given of the operation of the level shift circuit 10 according to this embodiment.

When the low supply voltage VCC is applied to the gate of the transistor NM11, the constant current Ic depending on the low supply voltage VCC flows through the drain of the transistor NM11. The constant current Ic flows through the resistor R1 and the transistors PM11 and PM12. The constant current Ic flowing through the transistors PM11 and PM12 is current-copied to the current mirror unit 12.

The gate of the transistor NM12 is supplied with the input signal INP, and the gate of the transistor NM13 is supplied with the inverted input signal INN. The signal levels of the input signal INP and the inverted input signal INN change complementarily to the VCC potential or 0 V.

When the input signal INP has a signal level of 0 V and the inverted input signal INN has a signal level of the VCC potential, the transistor NM12 is turned to an off-state (OFF state) and the transistor NM13 is turned to an on-state (ON state). The transistor NM13 in an ON state causes a current to flow from the drain to the source of the transistor NM13 and the gate potential of the transistor PM17 connected to the drain of the transistor NM13 to be lowered, thereby turning the transistor PM17 to an ON state. Since the transistor PM17 is in an ON state and the transistor NM12 is in an OFF state, the potential of the node n4 is increased to the VDD potential. The transistor PM18 is turned to an OFF state, and the node n5 has a potential of 0 V. Therefore, the node n4 outputs an output signal OUTN having a signal level of the VDD potential, and the node n5 outputs an output signal OUTP having a signal level of 0 V.

Next, when the input signal INP is changed in signal level to the VCC potential, and the inverted input signal INN is changed in signal level to 0 V, the transistor NM12 is turned to an ON state, and the transistor NM13 is turned to an OFF state. The transistor NM12 in an ON state causes a current to flow from the drain to the source of the transistor NM12 and the gate potential of the transistor PM18 connected to the drain of the transistor NM12 to be lowered, thereby turning the transistor PM18 to an ON state. Since the transistor PM18 is in an ON state and the transistor NM13 is in an OFF state, the potential of the node n5 is increased to the VDD potential. The transistor PM17 is turned to an OFF state, and the potential of the node n4 is lowered to 0 V. Therefore, the node n4 outputs the output signal OUTN having a signal level of 0 V, and the node n5 outputs the output signal OUTP having a signal level of the VDD potential.

The output signal OUTN is in phase with and different in signal level from the inverted input signal INN. More specifically, the output signal OUTN is acquired by a level shift, from the VCC potential to the VDD potential, of a signal level of the inverted input signal INN at logic level 1. The output signal OUTP is in phase with and different in signal level from the input signal INP. More specifically, the output signal OUTP is acquired by a level shift, from the VCC potential to the VDD potential, of a signal level of the input signal INP at logic level 1.

As described above, the input signal INP and the inverted input signal INN vary complementarily in signal level to the VCC potential or 0 V to flow a current from the drains to the sources of the transistors NM12 and NM13, thereby inverting the potentials of the nodes n4 and n5.

A decrease in the voltage level of the low supply voltage VCC leads to a decrease in the signal level of the input signal INP and the inverted input signal INN at an H level, thus decreasing the current capability of the transistors NM12 and NM13. However, since the low supply voltage VCC is applied to the gate of the transistor NM11 in the constant-current generation unit 11, the current value of the constant current Ic is also decreased. Therefore, irrespective of the decrease in the current capability of the transistors NM12 and NM13, it is possible to invert the potentials of the nodes n4 and n5 with reliability.

Furthermore, when the level shift circuit 10 is operated under a high-temperature condition or when the transistors NM11, NM12, and NM13 are designed under a process SLOW condition, an increase in the threshold voltage leads to a decrease in the current capability of the transistors NM12 and NM13. However, in the level shift circuit 10 according to this embodiment, the current capability of the transistor NM11 is also decreased, thus causing the current value of the constant current Ic to be reduced. Therefore, irrespective of the decrease in the current capability of the transistors NM12 and NM13, it is possible to invert the potential of the nodes n4 and n5 with reliability.

Furthermore, since an element size allowance needs not to be made by taking into account variations in the current capability of the transistors NM12 and NM13, it is possible to prevent an increase in chip footprint or size.

Second Embodiment

Figure 3:
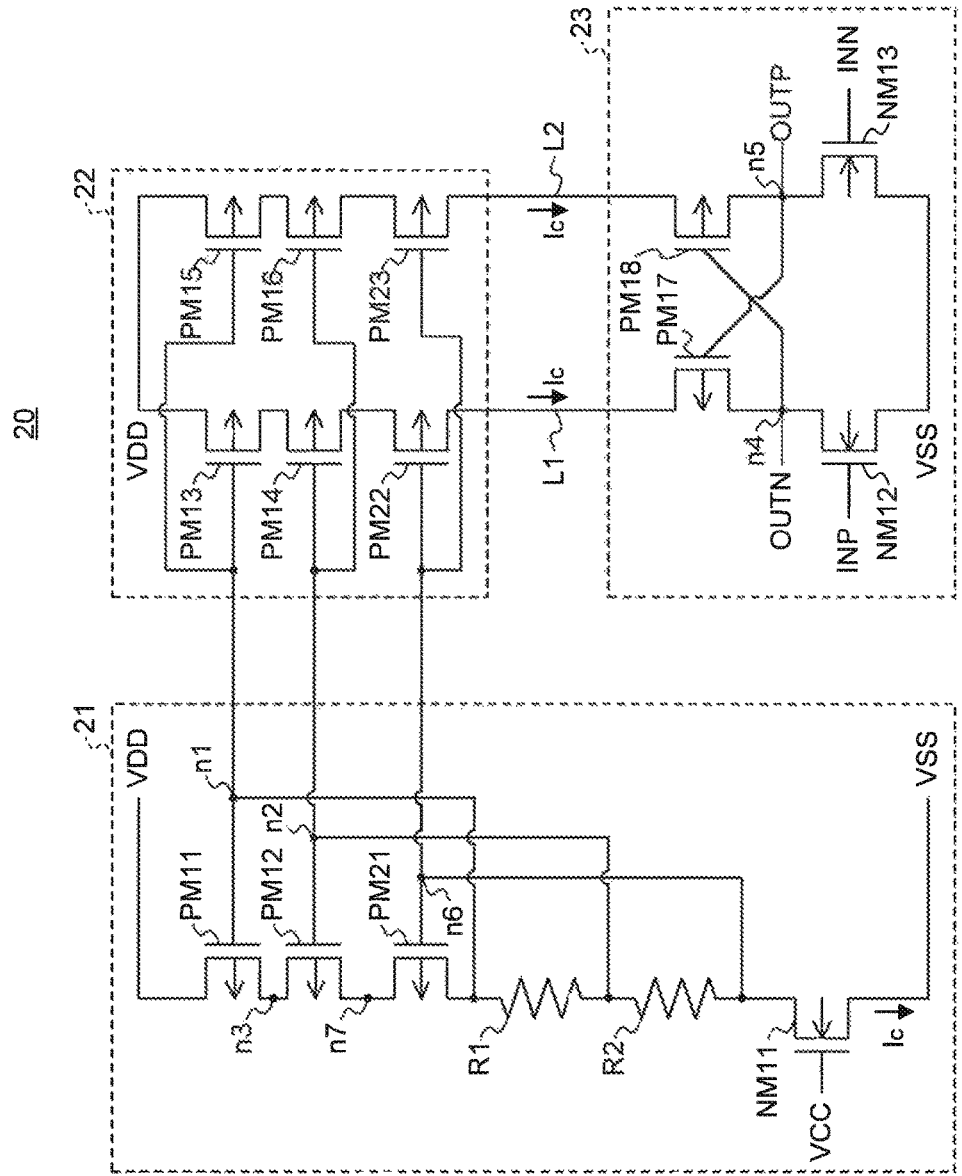
FIG. 3 is a circuit diagram illustrating a configuration of a level shift circuit according to a second embodiment.

FIG. 3 is a view illustrating a configuration of a level shift circuit 20 according to a second embodiment of the present invention. The level shift circuit 20 is comprised of a constant-current generation unit 21, a current mirror unit 22, and a level shift unit 23.

The constant-current generation unit 21 is different from the constant-current generation unit 11 according to the first embodiment in that the second embodiment includes a transistor PM21, which is a P-channel type MOS transistor, and a resistor R2.

The source of the transistor PM21 is connected via a node n7 to the drain of the transistor PM12. The drain of the transistor PM21 is connected to one end of the resistor R1. Furthermore, the drain of the transistor PM21 is connected to the node n1, and is also connected via the node n1 to the gate of the transistor PM11, the gate of the transistor PM13, and the gate of the transistor PM15. The gate of the transistor PM21 is connected to a node n6, and is also connected via the node n6 to the gates of transistors PM22 and PM23.

The resistor R2 has one end that is connected to the other end of the resistor R1 and the node n2, and the other end that is connected to the drain of the transistor NM11 and the node n6.

Figure 4:
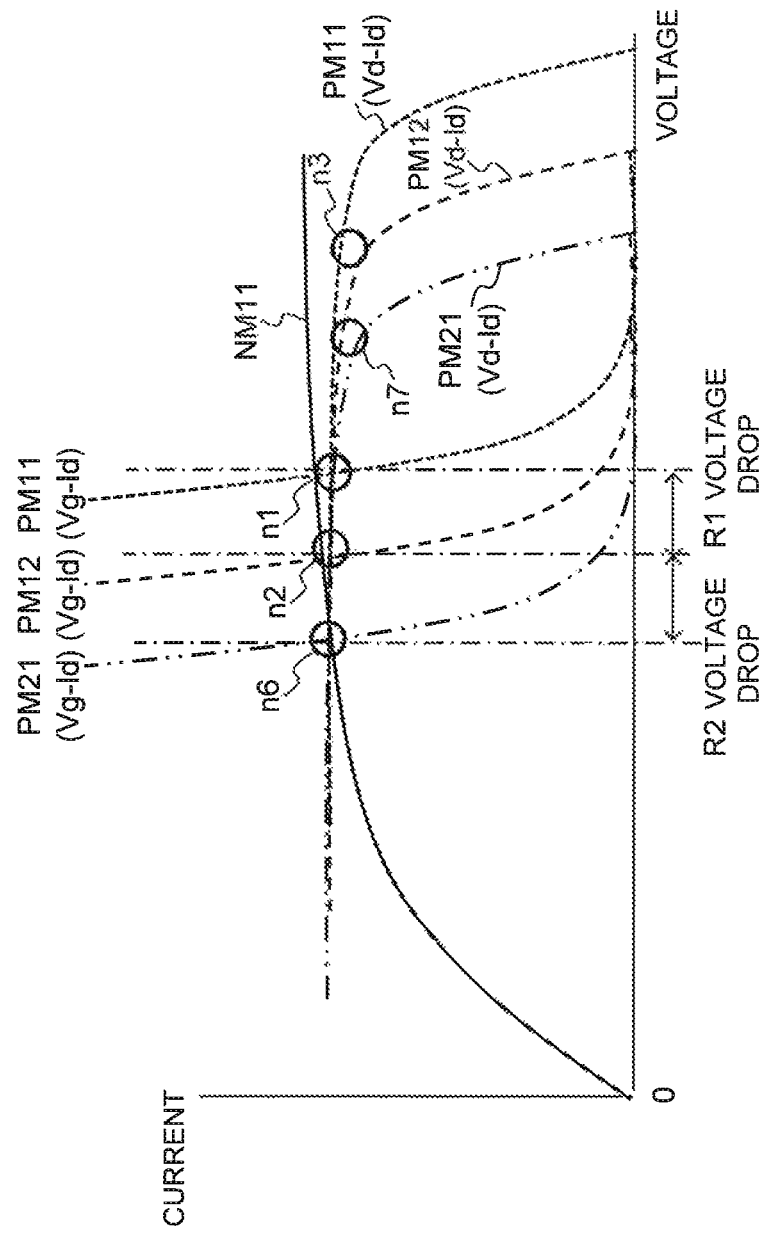
FIG. 4 is a view illustrating operating points of each unit in the level shift circuit according to the second embodiment.

FIG. 4 is a view illustrating the voltage-current curves of the resistor R1, the resistor R2, and the transistors NM11, PM11, PM12, and PM21. The potentials of the nodes n1, n2, and n6 (circled in the figure) are set by taking into account the operating point of each of the transistors PM11, PM12, and PM21. The resistance values of the resistors R1 and R2 are adjusted so that the potentials of the nodes n3 and n7 (circled in the figure) are in a good region of the constant-current characteristics of the transistors PM11 and PM12.

Referring again to FIG. 3, the current mirror unit 22 is different from the current mirror unit 12 according to the first embodiment in including the transistors PM22 and PM23 that are a P-channel type MOS transistor.

The source of the transistor PM22 is connected to the drain of the transistor PM14. The drain of the transistor PM22 is connected to the source of the transistor PM17. The gate of the transistor PM22 is connected via the node n6 to the gate of the transistor PM21, the other end of the resistor R2, and the drain of the transistor NM11.

The source of the transistor PM23 is connected to the drain of the transistor PM16. The drain of the transistor PM23 is connected to the source of the transistor PM18. The gate of the transistor PM23 is connected via the node n6 to the gate of the transistor PM21, the other end of the resistor R2, and the drain of the transistor NM11.

The transistors PM11 and PM13 have the gates connected together via the node n1, the transistors PM12 and PM14 have the gates connected together via the node n2, and the transistors PM21 and PM22 have the gates connected together via the node n6, thereby constituting a current mirror circuit. This allows a current flowing through the constant-current generation unit 21 to be copied and the constant current Ic to flow through the line L1 connected to the drain of the transistor PM22. That is, the transistors PM11, PM12, PM21, PM13, PM14, and PM22 constitute a three-stage cascade constant-current source.

The transistors PM11 and PM15 have the gates connected together via the node n1, the transistors PM12 and PM16 have the gates connected together via the node n2, and the transistors PM21 and PM23 have the gates connected together via the node n6, thereby constituting a current mirror circuit. This allows a current flowing through the constant-current generation unit 21 to be copied and the constant current Ic to flow through the line L2 connected to the drain of the transistor PM23. That is, the transistors PM11, PM12, PM21, PM15, PM16, and PM23 constitute a three-stage cascade constant-current source.

A description will now be given of the operation of the level shift circuit 20 according to this embodiment.

When the low supply voltage VCC is applied to the gate of the transistor NM11, the constant current Ic flows through the drain of the transistor NM11 depending on the low supply voltage VCC. The constant current Ic flows through the resistor R1, the resistor R2, and the transistors PM11, PM12, and PM21. The constant current Ic flowing through the transistors PM11, PM12, and PM21 is current-copied to the current mirror unit 22.

The gate of the transistor NM12 is supplied with the input signal INP, and the gate of the transistor NM13 is supplied with the inverted input signal INN. The input signal INP and the inverted input signal INN complementarily vary in the signal level to the VCC potential or 0 V.

When the input signal INP has a signal level of 0 V and the inverted input signal INN has a signal level of the VCC potential, the transistor NM12 is turned to an OFF state and the transistor NM13 is turned to an ON state. The transistor NM13 in an ON state causes a current to flow from the drain to the source of the transistor NM13, and the gate potential of the transistor PM17 connected to the drain of the transistor NM13 to be decreased, allowing the transistor PM17 to be turned to an ON state. Since the transistor PM17 is in an ON state and the transistor NM12 is in an OFF state, the potential of the node n4 is increased to the VDD potential. The transistor PM18 is turned to an OFF state, and the potential of the node n5 is turned to 0 V. Therefore, the node n4 outputs the output signal OUTN having a signal level of the VDD potential, and the node n5 outputs the output signal OUTP having a signal level of 0 V.

The output signal OUTN is in phase with and different in signal level from the inverted input signal INN. That is, the output signal OUTN is acquired by a level shift, from the VCC potential to the VDD potential, of a signal level of the inverted input signal INN at logic level 1. The output signal OUTP is in phase with and different in signal level from the input signal INP. That is, the output signal OUTP is acquired by a level shift, from the VCC potential to the VDD potential, of the input signal INP at logic level 1.

As described above, the input signal INP and the inverted input signal INN complementarily vary in signal level to the VCC potential or 0 V to flow a current from the drains to the sources of the transistors NM12 and NM13, thereby inverting the potentials of the nodes n4 and n5.

A decrease in the voltage level of the low supply voltage VCC leads to a decrease in the signal level of the input signal INP and the inverted input signal INN at an H level, thus decreasing the current capability of the transistors NM12 and NM13. However, since the low supply voltage VCC is applied to the gate of the transistor NM11 in the constant-current generation unit 21, the current value of the constant current Ic is also decreased. Therefore, irrespective of the decrease in the current capability of the transistors NM12 and NM13, it is possible to invert the potentials of the nodes n4 and n5 with reliability.

Furthermore, in the level shift circuit 20 according to this embodiment, the transistors PM11, PM12, PM21, PM13, PM14, and PM22 constitute a three-stage cascade constant-current source, and likewise, the transistors PM11, PM12, PM21, PM15, PM16, and PM23 constitute a three-stage cascade constant-current source. Thus, when compared with the case where a two-stage cascade constant-current source is employed, further improved constant-current characteristics are provided, thus resulting in a reduced variation in the constant current Ic when the voltages of the nodes n4 and n5 are varied from the VDD potential to 0 V. Therefore, it is possible to provide a substantially constant current slew rate at the nodes n4 and n5.

Third Embodiment

Figure 5:
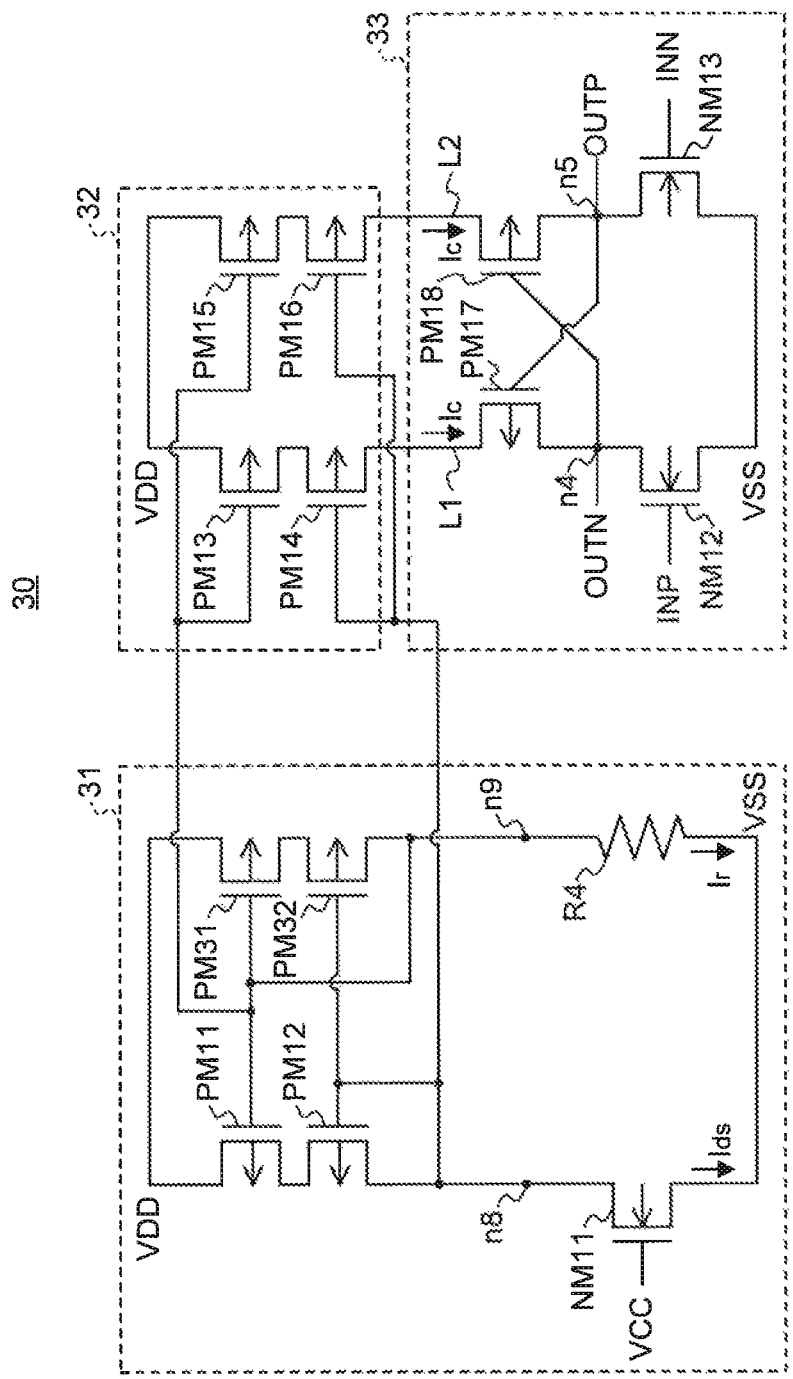
FIG. 5 is a circuit diagram illustrating a configuration of a level shift circuit according to a third embodiment.

FIG. 5 is a view illustrating a configuration of a level shift circuit 30 according to a third embodiment of the present invention. The level shift circuit 30 is comprised of a constant-current generation unit 31, a current mirror unit 32, and a level shift unit 33.

The constant-current generation unit 31 has transistors PM31 and PM32, which are a P-channel type MOS transistor, and a resistor R4. The transistors PM31 and PM32 and the resistor R4 are connected in series. Furthermore, unlike the constant-current generation unit 11 according to the first embodiment, the transistor PM12 and the transistor NM11 are connected together without a resistor interposed therebetween.

The drain of the transistor PM12 is connected via a node n8 to the drain of the transistor NM11.

The transistor PM31 has the source to which the supply voltage VDD is applied. The drain of the transistor PM31 is connected to the source of the transistor PM32. The gate of the transistor PM31 is connected to the gate of the transistor PM11, the gate of the transistor PM13, and the gate of the transistor PM15. The gates of the transistor PM31 and the transistor PM11 are connected together, thereby constituting a transistor pair.

The source of the transistor PM32 is connected to the drain of the transistor PM31. The drain of the transistor PM32 is connected to a node n9, and is connected via the node n9 to one end of the resistor R4. Furthermore, the drain of the transistor PM32 is connected to the gates of the transistors PM11 and PM31, and further to the gates of the transistors PM13 and PM15. The gate of the transistor PM32 is connected to the gate of the transistor PM12. Furthermore, the gate of the transistor PM32 is connected via the node n8 to the drain of the transistor NM11. Furthermore, the gate of the transistor PM32 is connected to the drain of the transistor PM12, the gate of the transistor PM14, and the gate of the transistor PM16. The gates of the transistor PM32 and the transistor PM12 are connected together, thereby constituting a transistor pair.

One end of the resistor R4 is connected to the node n9, and is connected via the node n9 to the drain of the transistor PM32, the gates of the transistors PM11 and PM31, and the gates of the transistors PM13 and PM15. The other end of the resistor R4 is connected to the ground potential VSS.

The transistors PM11, PM12, PM31, and PM32 constitute a current mirror circuit. The operation of the current mirror circuit is specified on the basis of a current Ids flowing between the drain and the source of the transistor NM11 and a current Ir flowing through the resistor R4. More specifically, each element has different operating points for [the current Ids]>[the current Ir] and for [the current Ir]>[the current Ids].

Figure 6:
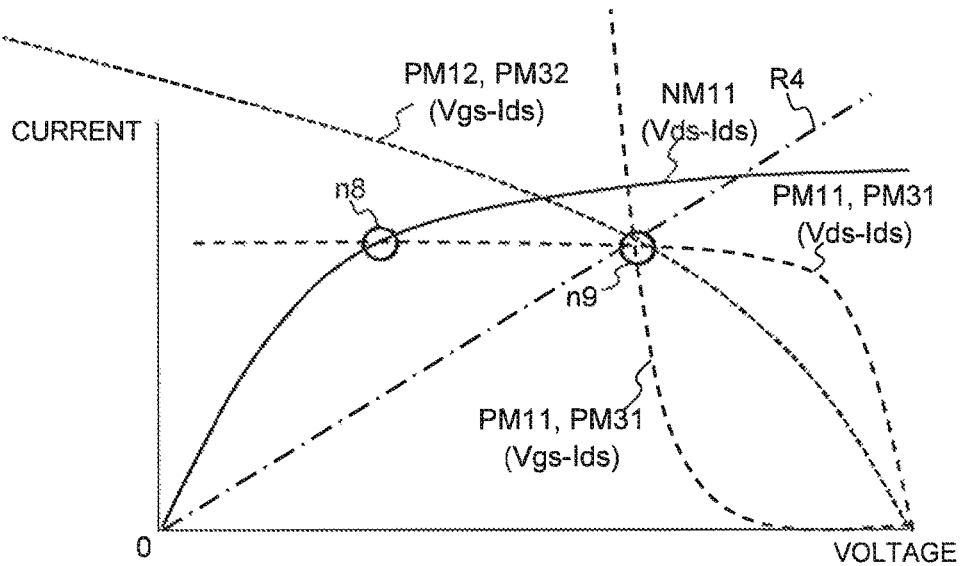
FIG. 6 is a view illustrating operating points of each unit in the level shift circuit according to the third embodiment.

FIG. 6 is a view illustrating the voltage-current curves of the resistor R4, and the transistors NM11, PM11, PM12, PM31, and PM32 for [the current Ids]>[the current Ir]. The potential of the node n8 is set by taking into account the operating points of the transistors NM11, PM11, and PM31. The potential of the node n9 is set by taking into account the operating points of the transistors PM11, PM31, PM12, and PM32.

Under the conditions that the low supply voltage VCC (i.e., the VCC potential) has a sufficiently high voltage level and the transistors NM11, NM12, and NM13 have a sufficient current capability, the node n8 takes the potential denoted by a circle in FIG. 6 (i.e., the potential near the intersection between the Vds-Ids curves of the transistors NM11 and PM11).

At that time, the transistors PM12 and PM32 have the gates to which a sufficient drive voltage is applied, and the transistors PM12 and PM32 have a low resistance between the drain and the source (the Vds-Ids curve of FIG. 6).

The low resistance of the transistor PM32 causes a sufficient current to flow through the transistor PM31, which is diode-connected, and the node n9 takes the potential denoted by a circle in FIG. 6 (i.e., the potential near the intersection of the Vds-Ids curve of the transistors PM11 and PM31, the Vgs-Ids curve of the transistors PM11 and PM31, and the Vds-Ids curve of the transistors PM12 and PM32).

The potentials of the nodes n8 and n9 serving as a bias voltage cause a sufficient constant current to flow through the current mirror unit 32 and the level shift unit 33, providing a high-speed level shifter.

Figure 7:
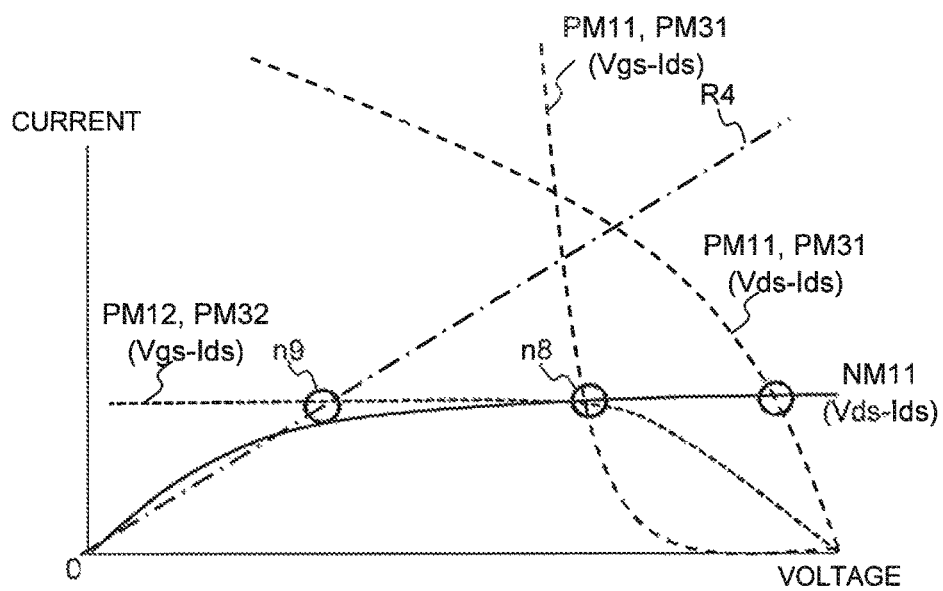
FIG. 7 is a view illustrating the operating points of each unit in the level shift circuit according to the third embodiment.

Meanwhile, FIG. 7 is a view illustrating voltage-current curves of the resistor R4, and the transistors NM11, PM11, PM12, PM31, and PM32 for [the current Ids]<[the current Ir].

The potential of the node n8 is set by taking into account the operating points of the transistors NM11, PM11, and PM31. The potential of the node n9 is set by taking into account the operating points of the transistors PM11, PM31, PM12, and PM32.

Under the conditions that the voltage level of the low supply voltage VCC (i.e., the VCC potential) is lowered, and the transistors NM11, NM12, and NM13 have an insufficient current capability, the node n8 takes the potential denoted by a circle in FIG. 7.

At that time, the drive voltages applied to the gates of the transistors PM12 and PM32 are lowered, and the transistors PM12 and PM32 have a high resistance between the drain and the source (the Vds-Ids curves of the transistors PM12 and PM32 of FIG. 7).

The high resistance of the transistor PM32 causes the node n9 to be at a low potential and the transistors PM11, PM31, PM13 and PM15 to have a low resistance (the Vds-Ids curves of the transistors PM11 and PM31 of FIG. 7).

The current mirror circuit comprised of the transistors PM12, PM32, PM14, and PM16 allows a current depending on the current capability of the transistors NM11, NM12, and NM13 to flow through the lines L1 and L2 as the constant current Ic.

As described above, with the potentials of the nodes n8 and n9 serving as a bias voltage, the constant current Ic flowing through the current mirror unit 32 and the level shift unit 33 is set.

In the level shift circuit 30 according to this embodiment, even under the condition of operating at low speeds (i.e., SLOW case) due to a decrease in the current capability of the transistors NM11, NM12, and NM13 resulting from, for example, a decrease in the VCC potential, it is possible for the level shift circuit 30 to perform a level shift operation with reliability.

In contrast to this, under the condition of operating at high speeds (i.e., FAST case), the resistance value of the resistor R4 can be adjusted to restrict the amount of the constant current Ic, thereby reducing variations relative to the case of operating at low speeds.

Furthermore, since the constant current Ic is reduced when the current capability of the transistors NM11, NM12, and NM13 is decreased, there will occur no malfunction. Therefore, since the transistors NM11, NM12, and NM13 are not required to have an element size allowance, it is possible to prevent an increase in chip footprint.

Furthermore, the resistance value of the resistor R4 can be adjusted so as to restrict the amount of the constant current Ic, thereby controlling the delay in the transition operation of the level shift circuit 30.

Note that the present invention is not limited to the aforementioned embodiments. For example, in the aforementioned embodiments, a description was given of an example in which the constant-current generation unit includes two or three P-channel type MOS transistors connected in series to the supply voltage VDD (the VDD potential). However, the number of transistors is not limited thereto, and n (2 or greater) transistors may be connected in series.

Furthermore, in the aforementioned embodiments, illustrated were examples in which the level shift circuits were used in a display driver. However, the invention is not limited thereto, and for example, it is also possible to use the same for a product that includes a high-voltage circuit such as a power supply controller or a step-up controller.

Furthermore, the level shift circuits of the aforementioned embodiments are also applicable to a circuit having a constant-current source such as a differential amplifier circuit in addition to a bias circuit for a level shifter including a high-voltage circuit.

This application is based on a Japanese Patent Application No. 2017-087240 which is hereby incorporated by reference.

What is claimed is:

1. A level shift circuit comprising:

a constant-current generation unit configured to generate a constant current on a basis of a high power supply voltage and a low power supply voltage;

a current mirror unit configured to flow said constant current through a first line and a second line; and a level shift unit configured to receive a first input signal and a second input signal being inputted, the first input signal being changed in signal level to a high logic having a potential level of said low power supply voltage and a low logic level having a potential level of a ground potential, the second input signal being a phase-inverted signal of said first input signal, the level shift unit being configured to produce a first output signal and a second output signal that are acquired by shifting the signal level at said high logic level of said first input signal and said second input signal from said potential level of said low power supply voltage to a potential level of said high power supply voltage, the level shift unit being further configured to output said first output signal from a second node on said second line and output said second output signal from a first node on said first line, wherein said constant-current generation unit includes:

a current adjustment transistor to which said low power supply voltage is applied, the current adjustment transistor being configured to vary a value of said constant current depending on a variation in said low power supply voltage;

first to nth transistors (n is 2 or 3) of a first conductivity type that are connected in series to said high power supply voltage; and at least one resistor element connected between said nth transistor and said current adjustment transistor;

said first to nth transistors constitute an n-stage current mirror circuit with each gate terminal connected to said current mirror unit; and said current adjustment transistor is a transistor of a second conductivity type opposite in conductivity type to said first conductivity type, and has a source terminal connected to the ground potential and a gate terminal to which said low power supply voltage is applied.

2. A level shift circuit comprising:

a constant-current generation unit configured to generate a constant current on a basis of a high power supply voltage and a low power supply voltage;

a current mirror unit configured to flow said constant current through a first line and a second line; and a level shift unit configured to receive a first input signal and a second input signal being inputted, the first input signal being changed in signal level to a high logic having a potential level of said low power supply voltage and a low logic level having a potential level of a ground potential, the second input signal being a phase-inverted signal of said first input signal, the level shift unit being configured to produce a first output signal and a second output signal that are acquired by shifting the signal level at said high logic level of said first input signal and said second input signal from said potential level of said low power supply voltage to a potential level of said high power supply voltage, the level shift unit being further configured to output said first output signal from a second node on said second line and output said second output signal from a first node on said first line, wherein said constant-current generation unit includes:

a current adjustment transistor to which said low power supply voltage is applied, the current adjustment transistor being configured to vary a value of said constant current depending on a variation in said low power supply voltage;

first to nth transistors (n is 2 or 3) of a first conductivity type that are connected in series to said high power supply voltage;

(n+1)th to (2n)th transistors of said first conductivity type of which gate terminals are connected to respective gate terminals of said first to nth transistors to constitute transistor pairs and which are connected in series to said high power supply voltage; and at least one resistor element connected between said (2n)th transistor and the ground potential;

said first to nth transistors constitute an n-stage current mirror circuit with each gate terminal connected to said current mirror unit; and said current adjustment transistor is a transistor of a second conductivity type opposite in conductivity type to said first conductivity type, and has a source terminal connected to the ground potential and a gate terminal to which said low power supply voltage is applied.

* * * * *